United States Patent
Leforestier et al.

(10) Patent No.: US 10,391,934 B2
(45) Date of Patent: Aug. 27, 2019

(54) METHOD FOR GENERATING A HORN ACTUATION SIGNAL USING A LOAD CELL FOR A STEERING WHEEL AND RELATED APPARATUS

(71) Applicant: AUTOLIV DEVELOPMENT AB, Vargarda (SE)

(72) Inventors: Sylvain Leforestier, Doudeauville (FR); Paul Lebarbier, Sotteville-les-Rouen (FR)

(73) Assignee: AUTOLIV DEVELOPMENT AB, Vargarda (SE)

( * ) Notice: Subject to any disclaimer, the term of this patent is extended or adjusted under 35 U.S.C. 154(b) by 201 days.

(21) Appl. No.: 15/536,198

(22) PCT Filed: Dec. 9, 2015

(86) PCT No.: PCT/EP2015/079097

§ 371 (c)(1),
(2) Date: Jun. 15, 2017

(87) PCT Pub. No.: WO2016/096564

PCT Pub. Date: Jun. 23, 2016

(65) Prior Publication Data

US 2017/0341574 A1    Nov. 30, 2017

(30) Foreign Application Priority Data

Dec. 16, 2014   (DE) .................. 10 2014 018 497

(51) Int. Cl.
*B60Q 5/00* (2006.01)
*H03K 17/96* (2006.01)
(Continued)

(52) U.S. Cl.
CPC ............ *B60Q 5/003* (2013.01); *G01L 1/2225* (2013.01); *G01L 5/221* (2013.01); *H03K 17/965* (2013.01);
(Continued)

(58) Field of Classification Search
CPC ............... B60Q 5/003; H03K 17/9625; H03K 2217/94026; H03K 2217/94031; G01L 5/221

See application file for complete search history.

(56) References Cited

U.S. PATENT DOCUMENTS 5,398,962 A    3/1995   Kropp
5,965,952 A *  10/1999  Podoloff ................ B60Q 5/003
                                              280/728.3
(Continued)

FOREIGN PATENT DOCUMENTS

DE      695 06 029 T2    4/1994
DE      44 93 317 T1     6/1996
(Continued)

OTHER PUBLICATIONS

PCT/EP2015/079097 International Search Report and Written Opinion, dated Mar. 15, 2016.

*Primary Examiner* — Jared Fureman
*Assistant Examiner* — Duc M Pham
(74) *Attorney, Agent, or Firm* — Brinks Gilson & Lione

(57) ABSTRACT

A method and an apparatus for generating a horn actuation signal. A load cell is placed inside a steering wheel, which changes its resistance when being stressed or deformed by a force transmitting part of the steering wheel. An actual voltage ($V_a$) depending on the resistance of the load cell is measured and the horn actuation signal is generated based on the measurement of the actual voltage ($V_a$). The actual voltage ($V_a$) depends additionally to the resistance of the load cell and on an adjustable voltage ($V_{ad}$) generated by an adjustable voltage generation unit. Additionally, the result of the measurement of the actual voltage ($V_a$) is permanently compared to a defined value, and the adjustable voltage ($V_{ad}$) is adjusted in response to the difference between the result of the measurement of the actual voltage ($V_a$) and the defined value at least as long as no horn actuation signal is generated, such that closed circuit for controlling the actual voltage ($V_a$) is provided.

12 Claims, 3 Drawing Sheets

(51) Int. Cl.
*G01L 5/22* (2006.01)
*G01L 1/22* (2006.01)
*H03K 17/965* (2006.01)

(52) U.S. Cl.
CPC ............... *H03K 17/9625* (2013.01); *H03K 2217/94026* (2013.01); *H03K 2217/94031* (2013.01); *H03K 2217/9651* (2013.01)

(56) References Cited

U.S. PATENT DOCUMENTS

| | | | | |
|---|---|---|---|---|
| 6,236,309 | B1* | 5/2001 | Haag | B60Q 5/003 280/728.1 |
| 9,007,190 | B2* | 4/2015 | Bosch | B60K 37/06 340/384.6 |
| 9,254,786 | B2* | 2/2016 | Verner | B60Q 5/003 |
| 2012/0004808 | A1* | 1/2012 | Kuramori | B62D 1/06 701/41 |

FOREIGN PATENT DOCUMENTS

| | | |
|---|---|---|
| DE | 699 13 703 T2 | 10/2004 |
| DE | 10 2009 011 623 A1 | 9/2010 |
| DE | 10 2011 088 489 A1 | 6/2013 |
| EP | 0 681 944 B1 | 11/1998 |
| GB | 2 296 328 A | 6/1996 |
| WO | WO 1994/27301 | 11/1994 |

\* cited by examiner

METHOD FOR GENERATING A HORN ACTUATION SIGNAL USING A LOAD CELL FOR A STEERING WHEEL AND RELATED APPARATUS

CROSS REF TO RELATED APPLICATIONS

This application is a 35 U.S.C. § 371 National Phase Application of PCT/EP2015/079097, filed Dec. 9, 2015, which claims the benefit of priority to German Patent Application Serial No.: DE 10 2014 018 497.8, filed Dec. 16, 2014, the contents of which are incorporated herein by references in their entirety.

FIELD OF THE INVENTION

The invention relates to a method for generating a horn actuation signal using a load cell being placed inside a steering wheel for a motor vehicle and an apparatus for carrying out this method.

BACKGROUND

In almost every steering wheel of a passenger car, a bus or a truck, a horn switch is located. For this purpose a movable part of the steering wheel is held on a non-movable part of the steering wheel in such a way that it can be pressed down against the force of a spring. This non-movable part is often the so-called steering wheel body and the movable part is often a part of an airbag module, for example the housing of the module (so called floating module concept) or the cover of the airbag module (so called floating cover concept). Often more than one horn switch is present, but for the sake of simplicity, reference is made to only one such horn switch in the following description.

In the simplest case, the horn switch is formed of a contact at the stationery part of the steering wheel and the mating contact on the movable part of the steering wheel. As long as no actuation force is applied to the movable part, the contacts are spaced part from another by means of the spring. If the movable part is pressed down against the force of the spring, the two contacts come in contact with one another and close an electrical circuit which leads to an actuation of the horn. One drawback of this design is that the contacts can be subjected to mechanical or electricalwear.

EP 2 326 534 describes a generic unit of the above-described type and suggests to use a load cell in form of a strain gauge in a horn switch of a steering wheel strain gage type. Load cells are resistors that change their electrical ohmic resistance in response to mechanical strain resulting from an applied force. A strain gauge is an example of a load cell. In the steering wheel described in EP 2 326 534, a strain gauge is placed between the stationery part of the steering wheel and a force transmitting part of the steering wheel, which is a movable part, in such a way that the strain gauge is stressed when the movable part is pressed down against the stationery part. The change of the electrical resistance of the strain gauge can be measured and the result of the measurement can be used for generating the horn actuation signal. In order to generate the horn actuation signal in response to the change of the electrical resistance of the strain gauge; one needs an electrical circuit, for example in form of a control and an evaluation unit. Such load cell type horn activation circuits enable horn operation without requiring displacement of the moveable component with respect to the first component of the magnitude as needed with spring and electrical contact systems. This characteristic can provide opportunities for new design features and moreover can reduce the generation of undesired buzz, squeak and rattling problems associated with movable parts.

In EP 2 326 534, the electrical resistance of the strain gauge is measured by using a Wheatstone bridge with the strain gauge or multiple strain gauges being part of the Wheatstone bridge. At the time the vehicle is started (and the horn is not pressed down) this control and evaluation unit measures the resistance of the strain gauge in its (not stressed) basic state and computes a zero value from this resistance based on a measured voltage. The resistance of the strain gauge is permanently determined by measuring an actual voltage and this actual voltage is compared to this zero value. The measured changes are interpreted and a horn actuation signal is derived from this.

Starting from this prior art it is the task of this invention to provide an enhanced device and method for generating a horn actuation signal using a load cell. Especially, it is a task to provide a more reliable horn actuation signal and to make it possible to use cost effective standard electronic elements.

This task is solved by a method and by an apparatus as described herein.

SUMMARY

It has been found out that, at least when using cost effective standard electric and electronic components, especially load cells, a single calibration at the time at which the vehicle is started, is often not sufficient in order to generate the horn signal in a reliable way. According to the invention it is suggested to permanently (i.e. continuously or cylically) calibrate the system using a closed circuit. This is achieved by the following measures: an adjustable voltage generated by an adjustable voltage generation unit is provided such that the actual voltage depends additionally to the ohmic (electrical) resistance of the load cell on that adjustable voltage. The result of the measurement of the actual voltage is permanently compared to a defined value, wherein "permanently" in most cases means repeated cyclically with a certain frequency. In response to the difference between the result of the measurement of the actual voltage and the defined value, the adjustable voltage is continuously adjusted, such that a closed loop for the actual voltage is generated and a continuous calibration takes place, at least as long as no horn actuation signal is generated.

Through the continuous calibration, changes of the environmental parameters, especially of thermal drift during operation of the associated vehicle, can be compensated. The method works with cost effective standard electronic parts.

It is preferred to run an initialisation before the "regular" mode is started. During this initialisation a start value for the actual voltage is searched and the generation of the horn actuation signal is preferably deactivated.

Since the actual voltage can vary significantly when the force transmission part acts on the load cell, it is preferred that the continuous adjustment of the actual voltage is interrupted when a horn actuation is detected.

Further preferred embodiments of the invention are defined in the following description of the preferred embodiment described below in view of the drawings.

BRIEF DESCRIPTION OF THE DRAWINGS

The invention is now explained in detail by means of a preferred embodiment in view of the drawings.

The figures show the following.

DETAILED DESCRIPTION

Figure 1:
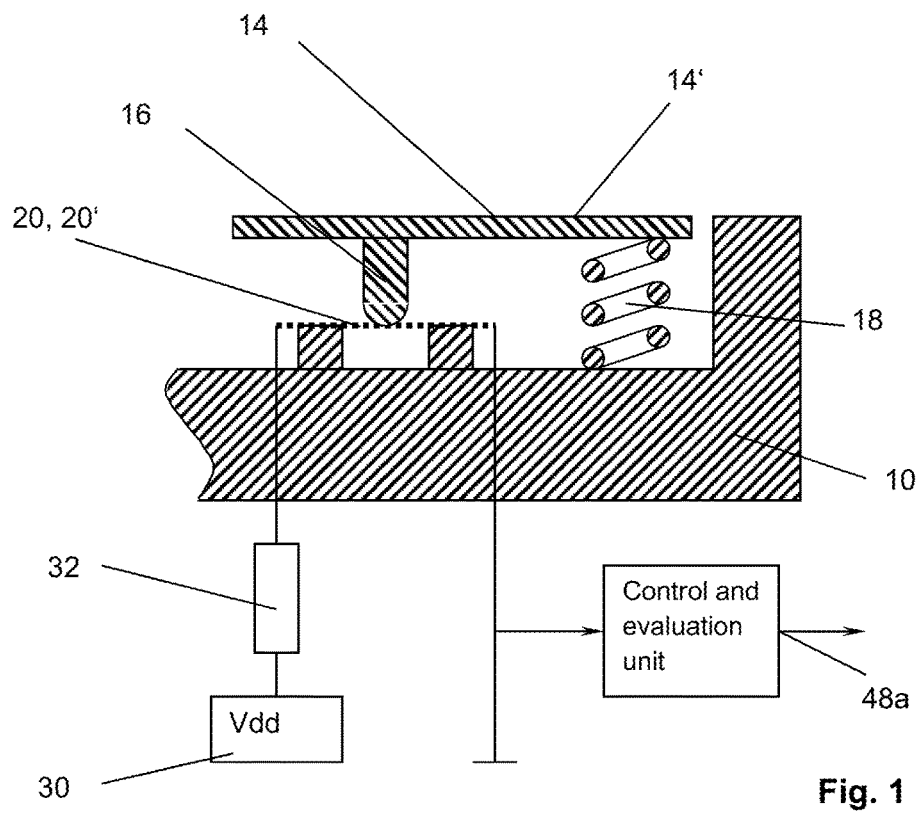
FIG. 1 shows a schematic view of a part of a steering wheel comprising a horn switch and a schematic representation of a circuit for the horn switch.
Figure 2:
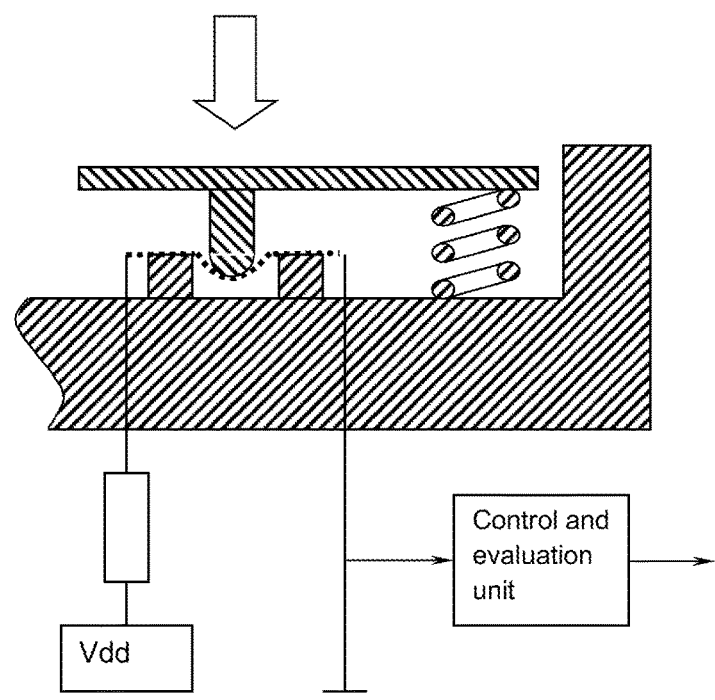
FIG. 2 shows what is shown in FIG. 1 when a movable part of the steering wheel is pressed down against a stationery part

FIG. 1 shows a very schematic representation of a part of a steering wheel including a horn switch, as well as an also very schematic representation of the electronics for this horn switch. This steering wheel includes a stationery part 10 which can be part of a steering wheel body, and a force transmission part 14 in form of a movable part 14' being held on the stationery part 10 of the steering wheel and being connected to the stationery part of the steering wheel 10 by a spring 18. The movable part 14' can be a part of an airbag module, for example a housing of an airbag module or a cover of an airbag module. A horn switch is provided such that a horn actuation signal can be generated when the movable part 14' of the steering wheel is pressed down by the vehicle operator. This horn switch includes a load cell 20 in form of a strain gauge 20' fixed to the stationery part of the steering wheel 10 and a post 16 extending from the movable part 14' such that when the movable part 14' is pressed down as designed by the arrow in FIG. 2, the post acts on the strain gauge 20' and the strain gauge is strained and thus its ohmic resistance is increased as depicted in FIG. 2. Of course other mechanical constructions can be chosen, for example the strain gauge 20' can be fixed to the movable part 14', or the strain gauge can extend between the stationary part 10 and the movable part 14'. The only essential thing is that the strain gauge 20 is strained (in the example of FIGS. 1 and 2 the strain gauge is deformed), when the movable part 14' is pressed down such that it changes its ohmic resistance. The mechanical layout shown in FIGS. 1 and 2 is only one example. It should be noted that strain gage 20' may include one or more resistance legs, including a configuration formed as a four segment Wheatstone bridge.

Figure 3:
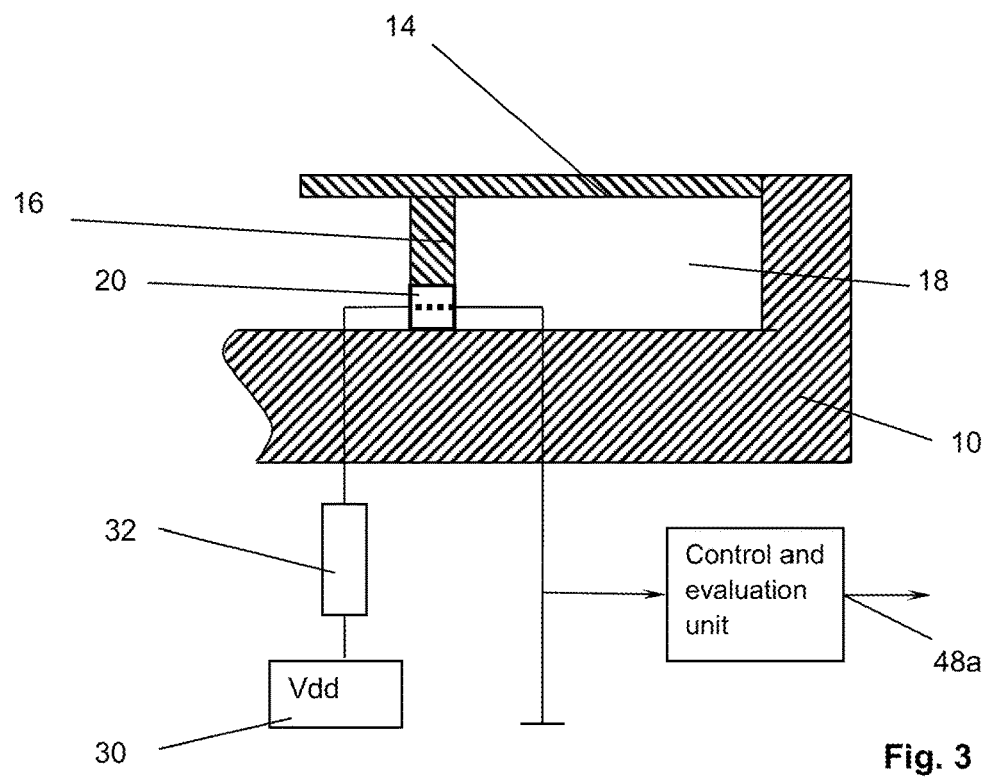
FIG. 3 shows an alternative embodiment in a representation according to FIG. 1.
Figure 4:
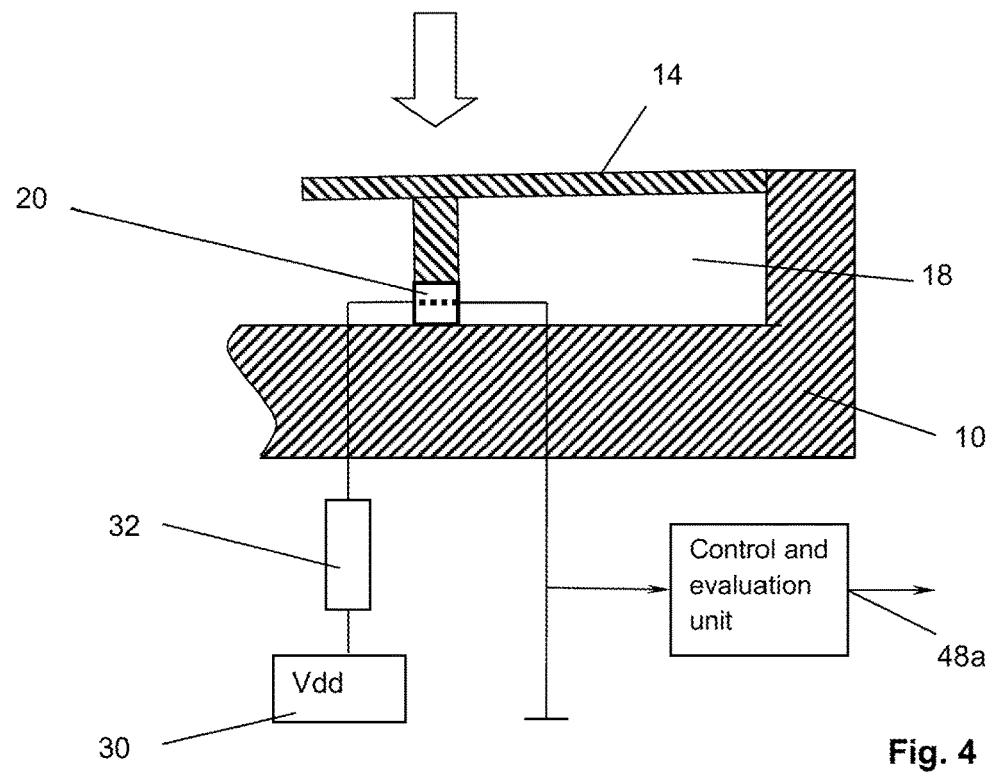
FIG. 4 shows what is shown in FIG. 3 in a state of actuation according to FIG. 2.

FIGS. 3 and 4 show an example in which the force transmitting part 14 does not need to be movable over a significant displacement and which does not need a spring. Here, the load cell 20 is permanently in direct contact of both the stationary part 10 and the force transmitting part 14. The stationary part 10 and the force transmitting part 14 can be directly connected to each other at least in sections, as is shown in FIG. 3, so that no clearance between the stationary part 10 and the force transmitting part 14 is needed. When a pushing force designated by the arrow is applied to the force transmitting part 14 in the area of the load cell (FIG. 4), this force is transmitted by the force transmitting part 14 to the load cell 20 such that the load cell 20 is strained and its ohmic resistance changes. During the load transmission, the load transmitting part 14 can be slightly elastically deformed.

Figure 5:
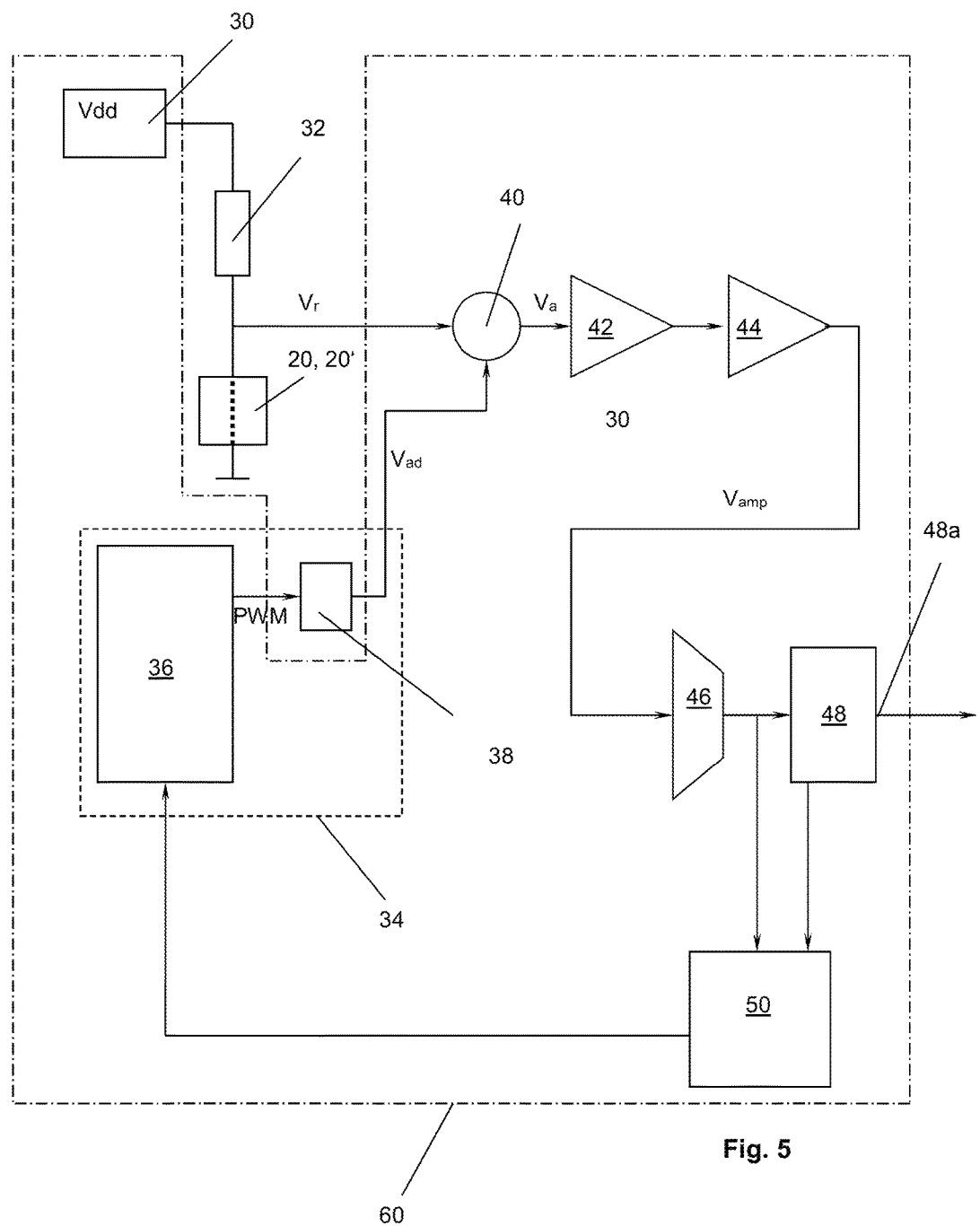
FIG. 5 is a schematic but more detailed representation of the electronics used for generating a horn actuation signal based on the ohmic resistance of a load cell being part of the horn switch.

The load cell 20 is electrically connected to an electronic circuit which can be looked at as being formed of a constant voltage source 30 and a control and evaluation unit which has an output 48a for the horn actuation signal. In practice most of the control and evaluation unit as well as the constant voltage source 30 can be a part of a microcontroller 60 as is shown in FIG. 5. But basically it would also be possible to design this control and evaluation unit of discrete elements, but still it should be emphasised that the use of a microcontroller is preferred. Although at least partially integrated in in a microcontroller, the functional elements are referred to as "units" in FIG. 5 and in its description for the sake of linguistic clearness. But since this "units" do not need to be physical units, the more general term descriptive terms are used.

With reference to FIG. 5, an embodiment of the electronics (meaning basically the control and evaluation circuit) is described. As has already been mentioned, most of the described components can be integrated in a microcontroller 60, but in order to explain the electronic circuit, discrete units are shown, although most of them can be functionally part of the aforementioned microcontroller 60.

First, the constant voltage source 30 providing voltage $V_{ad}$ is connected to the load cell 20 via a resistor 32, which can for example have a resistance of 10 kΩ. The load cell 20 is connected to the resistor 32 and to ground and can for example have an ohmic resistance of for example 480 Ω in its basic state. The voltage $V_r$ between the load cell 20 and the first resistor 32 is supplied to a differentiating circuit 40. This voltage is referred to as raw voltage $V_r$ since it only depends on the constant voltage $V_{ad}$, the resistance of the resistor 32, and the resistance of the load cell 20. The other input of the differentiating circuit 40 is connected to an adjustable voltage generation unit 34 whose output voltage is denoted as adjustable voltage $V_{ad}$. This adjustable voltage generation unit 34 is basically an analog to digital (A/D) converter and in the embodiment shown it provides a pulse width modulation (PWM) output 36 of the microcontroller 60 and of a filter 38 which "flattens" the PWM signal. This kind of generating an adjustable voltage is known in the art. Here a PWM voltage is defined in magnitude by its equivalent DC value.

The differentiating circuit 40 subtracts or compares the raw voltage $V_r$ from the adjustable voltage $V_{ad}$ or vice versa, such that the output voltage $V_a$ of this differentiating circuit 40 is the difference between these two voltages. This voltage is referred to as actual voltage $V_a$. In the embodiment described, the raw voltage $V_r$ is subtracted from the adjustable voltage $V_{ad}$. This actual voltage $V_a$ is amplified by an amplification unit which is in this embodiment made up of two operational amplifiers 42 and 44. The output voltage of this amplification unit, referred to as amplified actual voltage $V_{amp}$, which is a direct function of the actual voltage $V_a$, is fed into an analog to a digital (A/D) converter 46. So, the amplification unit and the A/D converter 46 form a measuring unit for the measurement of the actual voltage $V_a$. The digital output signal of this A/D converter represents the result of the measurement of the actual voltage. The digital output of the A/D converter 46 is connected to a horn actuation detection unit 48 and to a voltage correction unit 50. The horn actuation unit 48 has an output 48a for outputting the horn actuation signal and the voltage correction unit 50 has an output which is connected to the adjustable voltage generation unit 34. Further, the horn actuation detection unit 48 and the first voltage correction unit 50 can be bi-directionally connected to one another.

The modes of operation of the described circuit are as follows.

There are two operation modes, namely the non-permanent (or non-continuos) initialisation mode which can for example be performed every time when the vehicle is started, and a permanent or continuous operation mode which is performed during driving of the vehicle, after the initialisation mode is finished. First, the initialisation mode is described.

The aim of the initialisation mode is to adjust the adjustable voltage $V_{ad}$ such that the actual voltage $V_a$ (or respectively the amplified first voltage $V_{amp}$) is adjusted such that the result of the measurement of the actual voltage (meaning the digital output) is inside a range around a defined value. For the further explanation is it assumed that the differentiating circuit 40 subtracts the raw voltage $V_r$ from the adjustable voltage $V_{ad}$ such that the actual voltage $V_a$ is positive as long as the value of the adjustable voltage $V_{ad}$ is greater than the value of the raw voltage $V_r$.

When the initialisation mode is started, the adjustable voltage generation unit 34 generates a starting voltage of the adjustable voltage $V_{ad}$. This starting voltage is, in the embodiment described, selected such that it is surely higher than the raw voltage $V_r$, so that a positive actual voltage $V_a$ is generated. This actual voltage $V_a$ is amplified via the amplification unit and the amplified actual voltage $V_{amp}$ is fed into the A/D converter 46. The digital signal from the A/D converter, which corresponds to the result of the measurement of the actual voltage $V_a$, is fed into the voltage correction unit 50 and compared to a defined value, which corresponds to a set voltage. In the following, "comparing the actual voltage to the set voltage" and "comparing the result of the measurement of the actual voltage to a defined value" is used interchangeably, since the meaning is the same. If it is found that the actual voltage $V_a$ is higher than the set voltage, the first voltage correction unit 50 controls the adjustable voltage generation unit 34 in such a way that the adjustable voltage $V_{ad}$ is reduced. In the embodiment shown this means that the pulse widths outputted from the output of the microcontroller are reduced. So, a new actual voltage $V_a$ is generated and again compared with the set voltage. If it is found that the actual voltage $V_a$ is lower than the set voltage, the voltage correction unit 50 controls the adjustable voltage generation unit 34 such that the adjustable voltage $V_{ad}$ is increased (meaning that the pulse widths of the PWM output are increased by one or several steps). If it is found that the actual voltage $V_a$ is higher than the set voltage, the first voltage correction unit 50 controls the adjustable voltage generation unit 34 such that the adjustable voltage $V_{ad}$ is decreased (meaning that the pulse widths of the PWM output are decreased by one or several steps), and so forth. This adjustment of the adjustable voltage $V_{ad}$ is executed with a defined frequency of for example several kHz. This frequency must be distinguished from the frequency of the PWM signal which is usually by more than a magnitude higher.

This initialisation mode is run until the result of the measurement of the actual voltage $V_a$ is stably inside a defined range around the defined value (or in other words: until the actual voltage $V_a$ has stably reached a value which is inside a range around the desired set voltage). During the initialisation mode, it is preferred that the adjustment performed by the voltage correction unit 50 starts with a large interval and then cuts the preceding intervals in half every round. This leads to a quick finding of the searched actual voltage $V_a$. During this initialisation mode, the horn actuation detection unit 48 is disabled.

After the initialisation mode is finished, the system switches to the permanent or continuous operation mode. During this mode, the system continues to adjust the actual voltage $V_a$ to the desired set voltage as described above via the closed loop as described above. During the permanent operation mode it can be preferred that the adjustment performed by the voltage correction unit 50 takes place in constant intervals of, for example, every one PWM step. In an alternative, the size of the intervals can vary in dependence of the measured difference between the actual voltage $V_a$ and the set voltage. So, changes of the basic resistance of the load cell 20 occurring because of, for example, changes in temperature, are compensated. When the horn actuation detection unit 48 detects a change of the actual voltage $V_a$ that indicates the actuation of the horn by the driver, it sends out a horn actuation signal via its output port 48a. Additionally, it stops the closed loop adjustment, so that the adjustable voltage $V_{ad}$ is kept constant such that the system does not try to adjust the actual voltage $V_a$ to the set voltage, as long as the load cell 20 is stressed due to a pressing down of the force transmitting part of the steering wheel. As soon as the horn actuation detection unit 48 finds that the horn actuation has ended, the closed loop continuous adjustment is again started. One typical event that can be judged as a horn actuation by the horn actuation detection unit 48 can be that the actual voltage changes rapidly and that this change has a duration of at least a predefined period of time, for example half a second.

It is possible that the sampling rate (this is the frequency in which the adjustable voltage $V_{ad}$ is adjusted) is higher during the initialisation than during the permanent operation.

The system can be adjusted in sensitivity (by a threshold parameter definition) at the steering wheel integration test.

Because the actual voltage is initially and continuously adjusted, the system is insensitive against changes in ambient temperature and series deviations of the components.

While the above description constitutes the preferred embodiment of the present invention, it will be appreciated that the invention is susceptible to modification, variation and change without departing from the proper scope and fair meaning of the accompanying claims.

The invention claimed is:

1. A method for generating a horn actuation signal using a load cell being placed inside a steering wheel, the load cell changing its electrical resistance when being strained or deformed by a force transmitting part of the steering wheel, such that the load cell changes the resistance when an external force is applied to the force transmitting part, the method comprising;
   providing a measurement of an actual voltage Va depending on the resistance of the load cell,
   generating the horn actuation signal based on the measurement of the actual voltage Va,
   further wherein the actual voltage Va depends in addition to the resistance of the load cell on an adjustable voltage Vad generated by an adjustable voltage generation unit,
   comparing the result of the measurement of the actual voltage Va is cyclically compared to a defined value, and
   cyclically adjusting the adjustable voltage Vad in response to the difference between the result of the measurement of the actual voltage Va and the defined value when no horn actuation signal is generated,
   such that closed loop control for the actual voltage $V_a$ is provided.

2. The method according to claim 1, further comprising in that a constant voltage is applied to the load cell such that a raw voltage $V_r$ is generated which depends on the constant voltage and on the resistance of the load cell but not on the adjustable voltage $V_{ad}$ of the adjustable voltage generation unit, and the actual voltage $V_a$ results from comparing the adjustable voltage $V_{ad}$ and the raw voltage $V_r$.

3. The method according to claim 1 in that the step of measuring the actual voltage $V_a$ comprises an analog to digital conversion using an A/D-converter.

4. The method according to claim 3, further comprising in that the output signal of the A/D-converter is used to generate the horn actuation signal and to adjust the adjustable voltage $V_{ad}$ generated by the adjustable voltage generation unit.

5. The method according to claim 1 further comprising in that during an initialisation mode, which is performed in advance of a permanent mode, the generation of the horn actuation signal is disabled.

6. The method according to claim 1 further comprising in that during the time in which a horn actuation signal is generated, the adjustment of the adjustable voltage $V_{ad}$ is disabled.

7. An apparatus adapted for generating a horn actuation signal associated with a steering wheel having a force transmitting part comprising:
a load cell being placed inside the steering wheel, the load cell changing its electrical resistance when being strained or deformed by the force transmitting part of the steering wheel, such that the load cell changes the resistance when an external force is applied to the force transmitting part,
a measurement unit for the permanent or periodic measurement of an actual voltage Va depending on the resistance of the load cell and
a horn actuation detection unit for generating the horn actuation signal based on the measurement of the actual voltage Va
an adjustable voltage generation unit for generating and supplying an adjustable voltage Vad such that the actual voltage Va depends additionally to the resistance of the load cell on the adjustable Vad voltage,
a voltage correction unit that is configured to compare the result of the measurement of the actual voltage Va is cyclically compared to a defined value, the voltage correction unit being connected to the measurement unit for measuring the actual voltage $V_a$ and to the adjustable voltage generation unit such that the adjustable voltage $V_{ad}$ is adjusted in response to the difference between the result of the measurement of the actual voltage $V_a$ and the defined value at least as long as no horn actuation signal is generated such that closed loop control for the actual voltage $V_a$ is provided.

8. The apparatus according to claim 7, further comprising in that a constant voltage is applied to the load cell such that a raw voltage $V_r$ is generated which depends on the constant voltage and on the resistance of the load cell but not on the adjustable voltage $V_{ad}$ of the adjustable voltage generation unit, and
the actual voltage $V_a$ results from comparing the adjustable voltage $V_{ad}$ and the raw voltage $V_r$.

9. The apparatus according to claim 7 in that the step of measuring the actual voltage $V_a$ comprises an analog to digital conversion using an ND-converter.

10. The apparatus according to claim 9, further comprising in that the output signal of the A/D-converter is used to generate the horn actuation signal and to adjust the adjustable voltage $V_{ad}$ generated by the adjustable voltage generation unit.

11. The apparatus according to claim 7 further comprising in that during an initialisation mode, which is performed in advance of a permanent mode, the generation of the horn actuation signal is disabled.

12. The apparatus according to claim 7 further comprising in that during the time in which a horn actuation signal is generated, the adjustment of the adjustable voltage $V_{ad}$ is disabled.

* * * * *